United States Patent
Daicho

(10) Patent No.: US 9,627,362 B2
(45) Date of Patent: Apr. 18, 2017

(54) ILLUMINATION DEVICE

(71) Applicant: Koito Manufacturing Co., Ltd., Tokyo (JP)

(72) Inventor: Hisayoshi Daicho, Shizuoka (JP)

(73) Assignee: KOITO MANUFACTURING CO., LTD., Tokyo (JP)

( * ) Notice: Subject to any disclaimer, the term of this patent is extended or adjusted under 35 U.S.C. 154(b) by 0 days.

(21) Appl. No.: 13/671,804

(22) Filed: Nov. 8, 2012

(65) Prior Publication Data
US 2013/0063020 A1    Mar. 14, 2013

Related U.S. Application Data

(63) Continuation of application No. PCT/JP2011/000682, filed on Feb. 8, 2011.

(30) Foreign Application Priority Data
May 17, 2010  (JP) ................................. 2010-113139

(51) Int. Cl.
*F21V 9/16*    (2006.01)
*H01L 25/075*    (2006.01)
(Continued)

(52) U.S. Cl.
CPC ........ *H01L 25/0753* (2013.01); *H01L 33/502* (2013.01); *H01L 33/60* (2013.01);
(Continued)

(58) Field of Classification Search
CPC ........... F21Y 2105/001; F21Y 2103/10; G02F 1/133603; H01L 25/0753
(Continued)

(56) References Cited

U.S. PATENT DOCUMENTS 5,962,971 A * 10/1999 Chen .................... H01L 33/507
257/E33.059
2002/0048163 A1* 4/2002 Kawakami et al. ............ 362/31
(Continued)

FOREIGN PATENT DOCUMENTS

| CN | 1725517 A | 1/2006 |
|----|-----------|--------|
| CN | 101345236 A | 1/2009 |

(Continued)

OTHER PUBLICATIONS

Machine Translation of Sakai et al. WO 2009/141982 A1, retrieved Feb. 10, 2014.*
(Continued)

*Primary Examiner* — Anh Mai
*Assistant Examiner* — Steven Horikoshi
(74) *Attorney, Agent, or Firm* — Buchanan Ingersoll & Rooney PC

(57) ABSTRACT

An illumination device includes a light-emitting device and a diffusion member. The light-emitting device has a plurality of light-emitting elements that emit light having a peak wavelength in a wavelength region of 380 to 420 nm, a first phosphor that emits visible light having a peak wavelength in a wavelength region of 560 to 600 nm, a second phosphor that is excited by ultraviolet ray or short-wavelength visible light and emits visible light in complementary color relationship with the visible light emitted by the first phosphor, and a light-transmitting member that covers the plurality of light-emitting elements and contains the first phosphor and the second phosphor dispersed therein. The diffusion member diffuses at least a part of the light emitting from the light-emitting device.

8 Claims, 5 Drawing Sheets

(51) Int. Cl.
*H01L 33/50* (2010.01)
*H01L 33/60* (2010.01)

(52) U.S. Cl.
CPC ............... *H01L 2224/45144* (2013.01); *H01L 2224/48091* (2013.01); *H01L 2224/73265* (2013.01); *H01L 2924/01322* (2013.01); *H01L 2924/09701* (2013.01)

(58) Field of Classification Search
USPC ...................... 313/502; 349/69, 71; 362/97.3
See application file for complete search history.

(56) References Cited

U.S. PATENT DOCUMENTS

| | | | |
|---|---|---|---|
| 2003/0214812 A1* | 11/2003 | Bourdelais et al. | 362/330 |
| 2006/0109681 A1* | 5/2006 | Kim et al. | 362/606 |
| 2006/0227545 A1* | 10/2006 | Mok et al. | 362/227 |
| 2007/0103939 A1* | 5/2007 | Huang et al. | 362/633 |
| 2009/0015138 A1* | 1/2009 | Daicho et al. | 313/503 |
| 2009/0201679 A1* | 8/2009 | Konaka | F21K 9/00 362/235 |
| 2010/0296021 A1* | 11/2010 | Jung et al. | 349/58 |
| 2011/0012141 A1* | 1/2011 | Le Toquin et al. | 257/89 |
| 2012/0262916 A1* | 10/2012 | Gadda | F21S 8/022 362/235 |

FOREIGN PATENT DOCUMENTS

| | | |
|---|---|---|
| CN | 101432895 A | 5/2009 |
| JP | 2004221528 A | 8/2004 |
| JP | 2005115372 A | 4/2005 |
| JP | 2006261540 A | 9/2006 |
| JP | 2009158462 A | 7/2009 |
| WO | 2009077278 A1 | 6/2009 |
| WO | WO 2009141982 A1 * | 11/2009 |
| WO | 2010023840 A1 | 3/2010 |

OTHER PUBLICATIONS

International Preliminary Report on Patentability, Dec. 10, 2012, 7 pages.
International Search Report, May 9, 2011, 4 pages.
Chinese Office Action (First Action) dated May 28, 2014, issued in corresponding Chinese Patent Application No. 201180024346 and an English translation thereof. (14 pgs).
Extended European Search Report issued by the European Patent Office on Jul. 10, 2015 in corresponding EP Application No. 11783177.6 (4 pages).

\* cited by examiner

300

300

ILLUMINATION DEVICE

CROSS-REFERENCE TO RELATED APPLICATIONS

This application is based upon and claims the benefit of priority from the prior Japanese Patent Application No. 2010-113139, filed on May 17, 2010, and International Patent Application No. PCT/JP2011/000682, filed on Feb. 8, 2011, the entire content of each of which is incorporated herein by reference.

FIELD OF THE INVENTION

The present invention relates to an illumination device.

DESCRIPTION OF THE RELATED ART

Conventionally, fluorescent lamps and electric lamps have often been used as a lamp for illumination. In recent years, as a replacement for such a lamp, various white light-emitting devices using a light-emitting diode are developed from the viewpoint of electric power consumption and lifetime. There are several techniques that realize white light using a light-emitting diode. For example, the white light is realized by a combination of a light-emitting diode that emits blue light and a phosphor that is excited by blue light to emit yellow light (Patent Document 1).

On the other hand, the light emitted by the light-emitting diode has a strong directivity and a small light-emission area. For this reason, it is difficult to irradiate a wide range with uniform brightness by a single light-emitting diode. Therefore, a lamp in which a plurality of light-emitting diodes are arranged may be considered. However, when large brightness unevenness is generated immediately above the light-emitting diode and in the peripheral parts, this causes illuminance unevenness. Therefore, in order to reduce the illuminance unevenness, a lamp or a light in which a diffusion plate is disposed above the light-exiting surface of the light-emitting diode is devised.

For example, a display lamp is known that includes a plurality of white light-emitting diodes and a light-transmitting plate having a transmittance random-reflection layer that reflects so that a part of the light of the light-emitting diode is scattered (See Patent Document 2). Also, aback light is known that includes a plurality of light-emitting diodes that are arranged and a diffusion body that is disposed above the light-emitting diodes so as to diffuse the light of the light-emitting diodes for supply to an LCD panel (Patent Document 3).

However, disposal of a so-called diffusion plate such as the light-transmitting plate or the diffusion body described above is a cause of decrease in the luminous flux that is emitted from the illumination device. In particular, in a light-emitting device in which a light-emitting diode that emits blue light and a phosphor that is excited by blue light to emit yellow light are combined, not only the aforesaid brightness unevenness but also a color unevenness is liable to be generated. For this reason, in order to suppress the illuminance unevenness by the radiation surface, a diffusion plate having a lower transmittance needs to be used, thereby giving rise to a cause of further decrease in the luminous flux.

SUMMARY OF THE INVENTION

The present invention has been made in view of such circumstances, and an object thereof is to provide an illumination device having a high equipment efficiency.

To solve the above-described problems, an illumination device according to an aspect of the present invention includes: a light-emitting device having a plurality of light-emitting elements that emit ultraviolet ray or short-wavelength visible light having a peak wavelength in a wavelength region of 380 to 420 nm, a first phosphor that is excited by the ultraviolet ray or short-wavelength visible light and emits visible light having a peak wavelength in a wavelength region of 560 to 600 nm, a second phosphor that is excited by the ultraviolet ray or short-wavelength visible light and emits visible light in complementary color relationship with the visible light emitted by the first phosphor, and a light-transmitting member that covers the plurality of light-emitting elements and contains the first phosphor and the second phosphor dispersed therein, so as to obtain white color by mixing the light from each of the phosphors; and a diffusion member that is disposed at a position opposite to the light-transmitting member and diffuses at least a part of the light emitted from the light-emitting device, wherein a volume concentration of the whole phosphors contained in the light-transmitting member is 0.01 vol % or more and 10 vol % or less, and the light-transmitting member is constructed to have a shape such that a thickness thereof in a direction perpendicular to a light-exiting surface of the light-emitting elements is 0.4 mm or more and 20 mm or less.

BRIEF DESCRIPTION OF THE DRAWINGS

Embodiments will now be described by way of examples only, with reference to the accompanying drawings which are meant to be exemplary, not limiting and wherein like elements are numbered alike in several Figures in which.

DETAILED DESCRIPTION OF THE INVENTION

Figure 1:
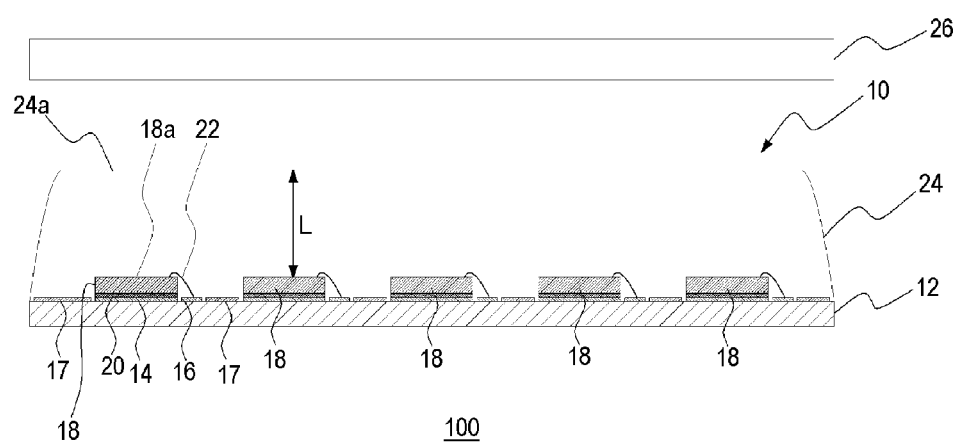
FIG. 1 is a schematic cross-sectional view of an illumination device according to an embodiment.

To solve the above-described problems, an illumination device according to an aspect of the present embodiment includes: a light-emitting device having a plurality of light-emitting elements that emit ultraviolet ray or short-wavelength visible light having a peak wavelength in a wavelength region of 380 to 420 nm, a first phosphor that is excited by the ultraviolet ray or short-wavelength visible light and emits visible light having a peak wavelength in a wavelength region of 560 to 600 nm, a second phosphor that is excited by the ultraviolet ray or short-wavelength visible light and emits visible light in complementary color relationship with the visible light emitted by the first phosphor, and a light-transmitting member that covers the plurality of light-emitting elements and contains the first phosphor and the second phosphor dispersed therein, so as to obtain white color by mixing the light from each of the phosphors; and a diffusion member that is disposed at a position opposite to the light-transmitting member and diffuses at least a part of the light emitted from the light-emitting device, wherein a volume concentration of the whole phosphors contained in the light-transmitting member is 0.01 vol % or more and 10 vol % or less, and the light-transmitting member is constructed to have a shape such that a thickness thereof in a direction perpendicular to a light-exiting surface of the light-emitting elements is 0.4 mm or more and 20 mm or less.

According to this embodiment, white light is obtained by mixing the visible light that is emitted from the first phosphor excited by the ultraviolet ray or short-wavelength visible light and having a peak wavelength in a wavelength region of 560 nm to 600 nm and the visible light that is emitted by the second phosphor excited by the ultraviolet ray or short-wavelength visible light and is in complementary color relationship with the visible light emitted by the first phosphor. Also, by suitably setting the volume concentration of the phosphors and the optical path length in the light-transmitting member, the light emitted by the light-emitting elements is efficiently absorbed in the phosphors, and also the light emitted by a phosphor is suppressed from being absorbed or scattered by another phosphor. For this reason, the color unevenness within the light-emission surface is suppressed as compared with an illumination device using a light-emitting device in which a blue light-emitting element and a yellow phosphor are combined. Thus, since the color unevenness that is a cause of illuminance unevenness is suppressed, an illumination device with little illuminance unevenness can be realized even when a diffusion plate having a comparatively high light transmittance is used.

The first phosphor may have an average particle size of 0.5 µm or more and 100 µm or less, and the second phosphor may have an average particle size of 0.5 µm or more and 100 µm or less. This facilitates dispersing the phosphors in the inside of the light-transmitting member, and also an efficient light emission can be made.

A relationship of Ia<0.5×Imax may be satisfied, where Imax is the maximum intensity of the excitation spectrum of the first phosphor, and Ia is the intensity of the excitation spectrum of the first phosphor at the peak wavelength of the light emission spectrum of the second phosphor. This suppresses the light emitted from the second phosphor from being absorbed by the first phosphor to emit light again.

The light-emitting elements may be disposed so that an interval thereof to adjacent light-emitting elements is within a range of 0.4 mm to 20 mm, preferably 0.5 mm to 15 mm. This suppresses the brightness unevenness on the light-emission surface, and a uniform illumination over a wider range can be made.

The diffusion member may be disposed so that a distance thereof to the light-transmitting member is within a range of 3 mm to 30 mm. This allows thickness reduction while suppressing the illuminance unevenness.

The diffusion member may have a transmittance within a range from 80% to 95%. This suppresses decrease in the luminous flux when the light emitting from the light-emitting device is transmitted through the diffusion member.

The diffusion member may have a diffusivity of 10% or more. This allows that the light emitting from the light-emitting device is suitably scattered, and the illuminance unevenness is suppressed.

The diffusion member may have a transmittance and a diffusivity that are set so that the variation in the brightness of a surface on the light-exiting side is 45% or less. This allows high-quality illumination with little illuminance unevenness.

Here, arbitrary combinations of the above-described constituent elements as well as those obtained by converting the expression of the present embodiment among the methods, apparatus, systems, and others are also effective as embodiments of the present invention.

According to the present embodiment, an illumination device having a high equipment efficiency can be provided.

Hereafter, embodiments for carrying out the present invention will be described in detail with reference to the drawings. Here, in the description of the drawings, identical elements will be denoted with identical reference numerals, and the duplicated description will be appropriately omitted.

FIG. 1 is a schematic cross-sectional view of an illumination device according to an embodiment. The illumination device 100 shown in FIG. 1 includes a light-emitting device 10 and a diffusion member 26 that diffuses at least a part of the light emitting from the light-emitting device 10. In the light-emitting device 10, plural pairs of electrodes 14 (positive electrodes) and electrodes 16 (negative electrodes) are formed on a substrate 12. On each electrode 14, a semiconductor light-emitting element 18 is fixed by a mounting member 20. The semiconductor light-emitting element 18 and the electrode 14 are electrically connected by the mounting member 20, and the semiconductor light-emitting element 18 and the electrode 16 are electrically connected by a wire 22. On the plurality of semiconductor light-emitting elements 18, a fluorescent layer 24 that integrally covers the plurality of semiconductor light-emitting elements 18 is disposed. In a region opposite to the substrate 12 with the fluorescent layer 24 sandwiched therebetween, the diffusion member 26 having a plate shape is disposed to oppose the fluorescent layer 24.

In a region where the electrodes 14, 16 and the semiconductor light-emitting elements 18 described above are not disposed among the regions on the substrate 12, a reflection surface 17 is formed. As a method for forming the reflection surface 17, there is the following method. First, an electrode part is formed on the substrate 12. In a state in which the electrode part is masked, a reflection coating of white acrylic series, urethane series, silicone series, fluorine series, or acryl-silicone series is formed thereon. Thereafter, the mask is removed, and the semiconductor light-emitting elements 18 are mounted. This allows that, even when the light emitted by a phosphor excited by the light emitted upwards from the semiconductor light-emitting elements 18 goes towards the substrate 12, the light is reflected upwards again by the reflection surface 17. This allows that, among the light generated from the phosphor, also the light going towards the substrate 12 side can be utilized for illumination, thereby improving the light collection efficiency.

The substrate 12 is preferably formed of a material having a high heat conductivity though not having an electric conductivity. For example, a ceramic substrate (aluminum nitride substrate, alumina substrate, mullite substrate, glass ceramic substrate), a glass epoxy substrate, or the like can be used. Here, when an insulating layer is formed under the electrodes 14, 16, a metal substrate (preferably a material having a high heat conductivity such as aluminum, copper, or brass), a SiC substrate, a carbon substrate, a composite substrate of metal and carbon, or the like can be used.

The electrode 14 and the electrode 16 are electrically conductive layers formed of a metal material such as gold or copper.

The semiconductor light-emitting element 18 is one example of a light-emitting element used in the light-emitting device of the present invention. For example, an LED, an LD, or the like that emits ultraviolet ray or short-wavelength visible light can be used. As a specific example, a compound semiconductor of InGaN series can be raised. Regarding the InGaN-series compound semiconductor, the light emission wavelength region changes in accordance with the content of In. When the content of In is large, the light emission wavelength tends to be a long wavelength. When the content of 1n is small, the light emission wavelength tends to be a short wavelength. However, it is confirmed that an InGaN-series compound semiconductor containing In to such a degree that the peak wavelength comes around 400 nm attains the highest quantum efficiency in the light emission. The semiconductor light-emitting element 18 according to the present embodiment is suitably one that emits ultraviolet ray or short-wavelength visible light having a peak wavelength in a wavelength region of 380 to 420 nm.

The mounting member 20 is, for example, an electrically conductive adhesive agent such as a silver paste, a gold tin eutectic solder, or the like. The mounting member 20 fixes the lower surface of the semiconductor light-emitting element 18 to the electrode 14 and electrically connects the lower-surface-side electrode of the semiconductor light-emitting element 18 to the electrode 14 on the substrate 12.

The wire 22 is an electrically conductive member such as a gold wire, and is joined to the upper-surface-side electrode of the semiconductor light-emitting element 18 and the electrode 16, for example, by supersonic thermal press-bonding or the like, so as to connect the two electrically.

The fluorescent layer 24 integrally seals the upper surface of the substrate 12 including the plurality of semiconductor light-emitting elements 18 by a binder member in which each of the phosphors described later is dispersed. The fluorescent layer 24 is formed, for example, by fabricating a fluorescent paste in which a phosphor is mixed into a binder member having a liquid form or a gel form, thereafter applying the fluorescent paste in a plate shape or in a tubular shape onto the upper surface of the semiconductor light-emitting elements 18, and subsequently curing the binder member of the fluorescent paste. As the binder member, for example, a silicone resin, a fluororesin, or the like can be used. Also, since the light-emitting device according to the present embodiment uses ultraviolet ray or short-wavelength visible light as an excitation light source, a binder member being excellent in ultraviolet ray resistance performance is preferable.

Also, substances having various physical properties other than the phosphor may be mixed into the fluorescent layer 24. By mixing a substance having a higher refractive index than the binder member, for example, a metal oxide, a fluorine compound, a sulfide, or the like into the fluorescent layer 24, the refractive index of the fluorescent layer 24 can be enhanced. This produces an effect such that the total reflection generated when the light generated from the semiconductor light-emitting elements 18 is incident into the fluorescent layer 24 is reduced, thereby improving the efficiency of collecting the excitation light into the fluorescent layer 24. Further, by reducing the particle size of the substance to be mixed to a nano size, the refractive index can be enhanced without lowering the transparency of the fluorescent layer 24. Also, white powder having an average particle size of 0.3 to 3 μm such as alumina, zirconia, or titanium oxide can be mixed as a light scattering agent into the fluorescent layer 24. This can prevent the brightness and chromaticity unevenness within the light emission surface. The fluorescent layer 24 is a light-transmitting layer that covers the semiconductor light-emitting elements 18, and functions as a light-transmitting member in which the first phosphor and the second phosphor described later are dispersed. Also, $SiO_2$ having a size of several nm to several hundred nm may be mixed. By mixing such transparent fine particles, the thixotropic property of the fluorescent paste is enhanced, whereby the shape maintenance of the applied fluorescent paste can be made, and sedimentation of the phosphor in the cured layer can be prevented.

The fluorescent layer 24 according to the present embodiment has a semi-tubular shape. Here, the shape of the fluorescent layer 24 is not limited to this, so that the shape maybe a rectangular parallelepiped. In any case, it is preferable that the distance L from the light-exiting surface 18a of each semiconductor light-emitting element 18 to the surface 24a of the fluorescent layer 24 located immediately thereabove does not vary greatly. Also, the fluorescent layer 24 is constructed to have a shape such that the thickness thereof in a direction perpendicular to the light-exiting surface 18a of the semiconductor light-emitting element 18 is 0.4 mm or more and 20 mm or less. With a fluorescent layer having such a shape, illumination with little illuminance unevenness can be made over a wide range by the light emitted from the plurality of semiconductor light-emitting elements 18.

The diffusion member 26 is disposed at a position opposite to the fluorescent layer 24 and is constructed to diffuse at least a part of the light emitted from the light-emitting device 10. As the diffusion member 26, for example, a resin having a high transparency such as acryl, polycarbonate, polystyrene, or polyester in which pigments or nano particles are dispersed is preferable. Also, glass suitably subjected to a blasting treatment can be used.

Next, each phosphor used in the light-emitting device according to the present embodiment will be described.
(First Phosphor)

The first phosphor is a phosphor that is excited by ultraviolet ray or short-wavelength visible light to emit visible light, and is a phosphor having a general formula represented by $(M^2_x, M^3_y, M^4_z)_m M^1 O_3 X_{(2/n)}$ (here, $M^1$ is one or more kinds of elements selected from the group consisting of Si, Ge, Ti, Zr, and Sn and containing at least Si; $M^2$ is one or more kinds of elements selected from the group consisting of Ca, Mg, Ba, and Zn and containing at least Ca; $M^3$ is one or more kinds of elements selected from the group consisting of Sr, Mg, Ba, and Zn and containing at least Sr; X is at least one kind of a halogen element; and $M^4$ is one or more kinds of elements selected from the group consisting of rare earth elements and Mn and containing at least $Eu^{2+}$. Also, m may be within a range of $1 \leq m \leq 4/3$, and n may be within a range of $5 \leq n \leq 7$. Also, x, y, and z may be within a range satisfying $x+y+z=1$, $0 < x < 0.99$, $0 < y < 0.99$, and $0.01 \leq z \leq 0.3$.). Also, the first phosphor is a phosphor that emits visible light having a peak wavelength in a wavelength region of 560 to 600 nm.

The first phosphor can be obtained, for example, in the following manner. Regarding the first phosphor, compounds represented by the following compositional formulas (1) to (4) can be used as source materials.
(1) $M^{t1}O_2$ ($M^{t1}$ is a tetravalent element such as Si, Ge, Ti, Zr, or Sn.)
(2) $M^{t2}O$ ($M^{t2}$ is a divalent element such as Mg, Ca, Ba, or Zn.)
(3) $M^{t3}X_2$ ($M^{t3}$ is a divalent element such as Mg, Sr, Ba, or Zn, and X is a halogen element.)
(4) $M^{t4}$ ($M^{t4}$ is a rare earth element such as $Eu^{2+}$ and/or Mn.)

As a source material of the compositional formula (1), for example, $SiO_2$, $GeO_2$, $TiO_2$, $ZrO_2$, $SnO_2$, or the like can be used. As a source material of the compositional formula (2), for example, carbonate, oxide, hydroxide, or the like of a divalent metal ion can be used. As a source material of the compositional formula (3), for example, $SrCl_2$, $SrCl_2.6H_2O$, $MgCl_2$, $MgCl_2.6H_2O$, $BaCl_2$, $BaCl_2.2H_2O$, $ZnCl_2$, $MgF_2$, $SrF_2$, $BaF_2$, $ZnF_2$, $MgBr_2$, $SrBr_2$, $BaBr_2$, $ZnBr_2$, $MgI_2$, $SrI_2$, $BaI_2$, $ZnI_2$, or the like can be used. As a source material of the compositional formula (4), for example, $Eu_2O_3$, $Eu_2(CO_3)_3$, $Eu(OH)_3$, $EuCl_3$, $MnO$, $Mn(OH)_2$, $MnCO_3$, $MnCl_2.4H_2O$, $Mn(NO_3)_2.6H_2O$, or the like can be used.

As a source material of the compositional formula (1), it is preferable that $M^1$ contains at least Si. Also, it may be one such that Si is partly replaced with at least one kind of an element selected from the group consisting of Ge, Ti, Zr, and Sn. In this case, a compound in which the ratio of Si occupying in $M^1$ is 80 mol % or more is preferable. As a source material of the compositional formula (2), it is preferable that $M^2$ contains at least Ca. Also, it may be one such that Ca is partly replaced with at least one kind of an element selected from the group consisting of Mg, Ba, Zn, and the like. In this case, a compound in which the ratio of Ca occupying in $M^2$ is 60 mol % or more is preferable. As a source material of the compositional formula (3), it is preferable that $M^3$ contains at least Sr. Also, it may be one such that Sr is partly replaced with at least one kind of an element selected from the group consisting of Mg, Ba, Zn, and the like. In this case, a compound in which Sr is contained at 30 mol % or more is preferable. Also, as a source material of the compositional formula (3), it is preferable that X contains at least Cl. Also, it may be one such that Cl is partly replaced with other halogen elements. In this case, a compound in which the ratio of Cl is 50 mol % or more is preferable. As a source material of the compositional formula (4), $M^4$ is preferably a rare earth element containing divalent Eu as an essential component, and may contain Mn or a rare earth element or the like other than Eu.

A source material mixture is obtained by weighing the source materials of the compositional formulas (1) to (4) so that the molar ratio thereof is (1):(2)=1:0.1 to 1.0, (2):(3)=1:0.2 to 12.0, and (2):(4)=1:0.05 to 4.0, preferably (1):(2)=1:0.25 to 1.0, (2):(3)=1:0.3 to 6.0, and (2):(4)=1:0.05 to 3.0, more preferably (1):(2)=1:0.25 to 1.0, (2):(3)=1:0.3 to 4.0, and (2):(4)=1:0.05 to 3.0, and putting each of the weighed source materials into an alumina mortar, followed by crushing and mixing for about 30 minutes. This source material mixture is put into an alumina crucible and fired in an electric furnace of reducing atmosphere in a predetermined atmosphere ($H_2$: $N_2$=5:95) and at a temperature of 700° C. or more and 1100° C. or less for 3 to 40 hours, so as to obtain a fired product. This fired product is washed carefully with hot pure water to wash the surplus chloride away, whereby the first phosphor can be obtained. The first phosphor is excited by ultraviolet ray or short-wavelength visible light and emits visible light.

Here, regarding the source material of the compositional formula (3) (divalent metal halide), it is preferable to weigh an excessive amount larger than the stoichiometric ratio. This is in consideration of the fact that a part of the halogen elements are vaporized and evaporated during the firing, and is for preventing generation of crystal defects of the phosphor deriving from the insufficiency of the halogen elements. Also, the source material of the compositional formula (3) added in an excessive amount is liquefied at the firing temperature and works as a fusing agent of solid phase reaction, thereby promoting the solid phase reaction and improving the crystallinity.

Here, after firing the above-described source material mixture, the above-described source material of the compositional formula (3) added in an excessive amount is present as an impurity in the produced phosphor. Therefore, in order to obtain a phosphor having a high purity and light-emission intensity, these impurities are preferably washed away by hot pure water. The compositional ratio shown in the general formula of the first phosphor of the present embodiment is a compositional ratio after the impurities are washed away, so that the source material of the compositional formula (3) added in an excessive amount to become an impurity is not considered in this compositional ratio.

(Second Phosphor)

The second phosphor is a phosphor having a light-emission color in complementary color relationship with the light-emission color of the first phosphor and having a peak wavelength at 430 to 480 nm. Such a second phosphor efficiently absorbs near ultraviolet ray or short-wavelength visible light and radiates light having a dominant wavelength at 440 to 470 nm. The phosphor that can be used as the second phosphor is not particularly limited in composition. However, selection can be made, for example, from among the phosphors (1) to (4) represented by the following general formulas.

(1) A phosphor having a general formula represented by $M^1_a(M^2O_4)_bX_c:Re_d$ (here, $M^1$ is one or more kinds of elements selected from the group consisting of Ca, Sr, Ba, Mg, Zn, Cd, K, Ag, and Tl and containing at least one of Ca, Sr, and Ba; $M^2$ is one or more kinds of elements selected from the group consisting of P, V, Si, As, Mn, Co, Cr, Mo, W, and B and containing at least P; X is at least one kind of a halogen element; and Re is one or more kinds of elements selected from the group consisting of rare earth elements and Mn and containing at least $Eu^{2+}$. Also, a is within a range of 4.2≤a≤5.8, b is within a range of 2.5≤b≤3.5, c is within a range of 0.8<c<1.4, and d is within a range of 0.01<d<0.1).

(2) A phosphor having a general formula represented by $M^1_{1-a}MgAl_{10}O_{17}:Eu^{2+}_a$ (here, $M^1$ is at least one or more kinds of elements selected from the group consisting of Ca, Sr, Ba, and Zn. Also, a is within a range of 0.001≤a≤0.5).

(3) A phosphor having a general formula represented by $M^1_{1-a}MgSi_2O_8:Eu^{2+}_a$ (here, $M^1$ is at least one or more kinds of elements selected from the group consisting of Ca, Sr, Ba, and Zn. Also, a is within a range of 0.001≤a≤0.8).

(4) A phosphor having a general formula represented by $M^1_{2-a}(B_5O_9) X:Re_a$ (here, $M^1$ is at least one or more kinds of elements selected from the group consisting of Ca, Sr, Ba, and Zn; and X is at least one kind of a halogen element. Also, a is within a range of 0.001≤a≤0.5).

One example of the second phosphor, that is, $(Ca, Mg)_5(PO_4)_3Cl:Eu^{2+}$ can be obtained, for example, in the following manner. Regarding the second phosphor, a source material mixture is obtained by using $CaCO_3$, $MgCO_3$, $CaCl_2$, $CaHPO_4$, and $Eu_2O_3$ as source materials, weighing these source materials in a predetermined ratio so that the molar ratio thereof is $CaCO_3$:$MgCO_3$:$CaCl_2$:$CaHPO_4$:$Eu_2O_3$=0.05 to 0.35:0.01 to 0.50:0.17 to 2.50:1.00:0.005 to 0.050, and putting each of the weighed source materials into an alumina mortar, followed by crushing and mixing for about 30 minutes. This source material mixture is put into an alumina crucible and fired in an $N_2$ atmosphere containing 2 to 5% of $H_2$ at a temperature of 800° C. or more and less than 1200° C. for 3 hours, so as to obtain a fired product. This fired product is washed carefully with hot pure water to wash the surplus chloride away, whereby the second phosphor can be obtained. The second phosphor emits visible light that is in complementary color relationship with the visible light emitted by the first phosphor.

Here, regarding the weighed amount (molar ratio) of $CaCl_2$ in obtaining the above-described source material mixture, it is preferable to weigh an excessive amount larger by at least 0.5 mol % than the stoichiometric ratio thereof relative to the compositional ratio of the second phosphor to be produced. This can prevent generation of crystal defects of the second phosphor deriving from the insufficiency of Cl.

EXAMPLES

Hereafter, the phosphors and the light-emitting device described above will be described further more specifically by using Examples. However, description of the source materials, production methods, chemical composition of the phosphors and the light-emitting device described below does not limit the embodiments of the phosphors and the light-emitting device of the present invention in any way.

First, the phosphors used in the light-emitting device of the present Example will be described in detail.

<Phosphor 1>

The phosphor 1 is one kind of the first phosphor and is a phosphor represented by $(Ca_{0.47}, Sr_{0.48}, Eu_{0.05})_{7/6}SiO_3Cl_{2/6}$. The phosphor 1 is synthesized so that $M^1$=Si, $M^2$=Ca, $M^3$=Sr, X=Cl, $M^4$=$Eu^{2+}$, m=7/6, n=6, and the contents x, y, and z of $M^2$, $M^3$, and $M^4$ are 0.47, 0.48, and 0.05, respectively, in the general formula of $(M^2x, M^3y, M^4z)_m M^1 O_3 X_{2/n}$. Also, in the phosphor 1, by adding an excessive amount of $SiO_2$ in the mixing ratio of the source materials, a cristobalite is created in the phosphor. For production of the phosphor 1, a source material mixture was obtained first by weighing each of the source materials of $SiO_2$, $Ca(OH)_2$, $SrCl_2.6H_2O$, and $Eu_2O_3$ so that the molar ratio thereof would be $SiO_2:Ca(OH)_2:SrCl_2.6H_2O:Eu_2O_3$=1.1:0.45:1.0:0.13, and putting each of the weighed source materials into an alumina mortar, followed by crushing and mixing for about 30 minutes. This source material mixture was put into an alumina crucible and fired in an electric furnace with a reducing atmosphere in a predetermined atmosphere ($H_2$: $N_2$=5:95) at a temperature of 1000° C. for 5 to 40 hours, so as to obtain a fired product. The obtained fired product was washed carefully with hot pure water to obtain the phosphor 1.

<Phosphor 2>

The phosphor 2 is a phosphor represented by $(Ca_{4.67}Mg_{0.5})(PO_4)_3Cl:Eu_{0.08}$. The phosphor 2 is one kind of the second phosphor described above. The phosphor 2 is a phosphor synthesized so that $M^1$=Ca/Mg (molar ratio of 90.3/9.7), $M^2$=P, X=Cl, Re=$Eu^{2+}$, a=5.17, b=3, c=1, and d=0.08 in the general formula of $M^1_a (M^2O_4)_b X_c:Re_d$. For production of the phosphor 2, a source material mixture was obtained first by weighing each of the source materials of $CaCO_3$, $MgCO_3$, $CaCl_2$, $CaHPO_4$, and $Eu_2O_3$ so that the molar ratio thereof would be $CaCO_3:MgCO_3:CaCl_2:CaHPO_4:Eu_2O_3$=0.42:0.5:3.0:1.25:0.04, and putting each of the weighed source materials into an alumina mortar, followed by crushing and mixing for about 30 minutes. This source material mixture was put into an alumina crucible and fired in an $N_2$ atmosphere containing 2 to 5% of $H_2$ at a temperature of 800° C. or more and less than 1200° C. for 3 hours, so as to obtain a fired product. The obtained fired product was washed carefully with hot pure water to obtain the phosphor 2.

Next, a structure of the light-emitting devices according to the Example and the Comparative Example will be described in detail.

<Structure of Light-Emitting Device>
(Example)

The light-emitting device according to the Example is one such that the following specific structure is used in the light-emitting device having a shape shown in FIG. 1. Here, in the light-emitting device according to the Example, five semiconductor light-emitting elements 18 are mounted in one row. The gap between the semiconductor light-emitting elements 18 is set to be 5 mm.

First, an aluminum nitride substrate (5 mm×40 mm×1 mm (thickness)) was used as the substrate 12, and plural pairs of electrodes 14 (positive electrodes) and electrodes 16 (negative electrodes) were formed thereon by using gold. As the semiconductor light-emitting element 18, a LED of 1 mm square having a light-emission peak at 405 nm (MvpLED™SL-V-U40AC manufactured by SemiLEDs Co., Ltd.) was used. Then, on a silver paste (84-1LMISR4 manufactured by Ablestick Co., Ltd.) that had been dropwise applied onto each of the electrodes 14 (positive electrodes) with use of a dispenser, the lower surface of the above-described semiconductor light-emitting element 18 was bonded, and the silver paste was cured for one hour in a 175° C. environment. Also, as the wire 22, a gold wire of ϕ45 μm was used, and this gold wire was joined to the upper-surface-side electrode of the semiconductor light-emitting element 18 and the electrode 16 (negative electrode) by supersonic thermal press-bonding. Also, a silicone resin serving as the binder was used, and this was mixed with various phosphors so as to attain a predetermined concentration, thereby to fabricate a fluorescent paste.

As a method of preparing a fluorescent paste, first the phosphor 1 and the phosphor 2 described above were mixed at a weight ratio of 2:1 and adjusted so as to enter a white chromaticity. Thereafter, as a matrix material for fabricating the fluorescent paste, a dimethylsilicone resin (JCR6126 manufactured by Toray Dow Corning Silicone Co., Ltd.) was used and weighed so as to attain a phosphor concentration of 3 vol %. The fluorescent paste was fabricated by putting about 3 to 5 g of the above-described binder material and the above-described phosphor that had been weighed into an ointment container of 10 cc and mixing/defoaming them for 90 seconds at an orbital rotation of 1200 revolutions and at a self-spinning of 400 revolutions by using a self-spinning/orbital rotation mixer (Mazerustar manufactured by Kurabow Co., Ltd.).

Here, the fluorescent paste was adjusted to have a viscosity in accordance with the transparency, dispersibility, and molding/filling processability. Thereafter, the plurality of semiconductor light-emitting elements 18 mounted on the substrate were integrally covered with the fluorescent paste by using a processing method such as potting, compression molding, transfer molding, or injection molding.

As the binder material, a material being transparent (having a transmittance of 90% or more) to near ultraviolet ray or short-wavelength visible light and having a good optical resistance was used. Specifically, a silicone resin, a fluororesin, a sol gel glass, an acrylic resin, an inorganic binder, a glass material, or the like can be used. Also, a diffusing agent and a thixotropic agent may be added into the binder paste. Specifically, fine particles such as silicon dioxide, titanium oxide, aluminum oxide, and barium titanate can be raised as examples.

In the light-emitting device according to the Example, a fluorescent paste was fabricated by mixing/dispersing/defoaming a predetermined amount of the phosphor in a silicone resin into which silica fine particles had been dispersed as a thixotropic agent. Thereafter, the fluorescent paste was subjected to dispensing application onto the semiconductor light-emitting elements with use of a dispenser, followed by curing to fasten for 1.5 hours in a 150° C. environment. By this, the dimension of the fluorescent paste subjected to dispensing application after the curing came to have a shape with a width of about 4 to 8 mm, a height of about 2 to 5 mm, and a length of about 25 mm, whereby the semiconductor light-emitting elements 18 were sealed.

Comparative Example

Figure 2:
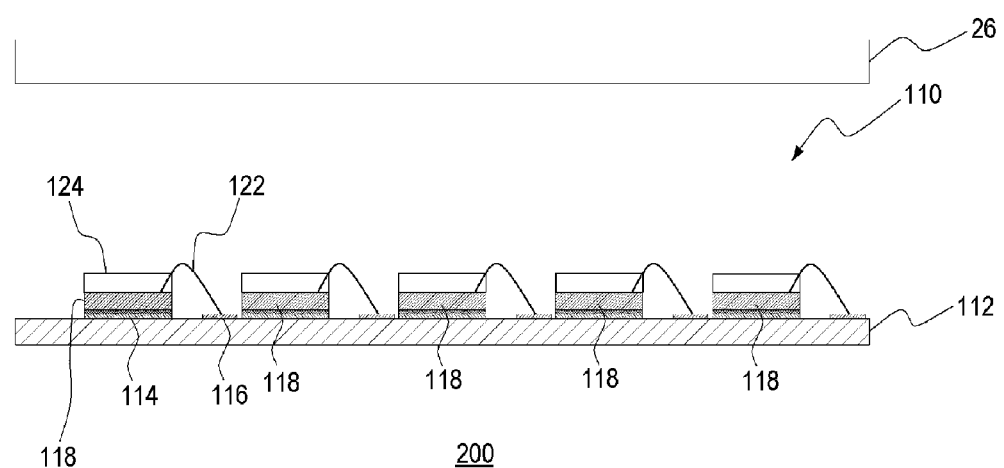
FIG. 2 is a schematic cross-sectional view of an illumination device according to a Comparative Example.

FIG. 2 is a schematic cross-sectional view of an illumination device according to a Comparative Example. The illumination device 200 shown in FIG. 2 includes a light-emitting device 110 and a diffusion member 26 that diffuses at least a part of the light emitted from the light-emitting device 110. In the light-emitting device 110, plural pairs of positive electrodes 114 and negative electrodes 116 are formed on a substrate 112. On each positive electrode 114, a semiconductor light-emitting element 118 is fixed by a mounting member (not illustrated in the drawings). The semiconductor light-emitting element 118 and the positive electrode 114 are electrically connected by the mounting member, and the semiconductor light-emitting element 118 and the negative electrode 116 are electrically connected by a wire 122. On the upper surface of each semiconductor light-emitting element 118, a fluorescent layer 124 is separately and individually mounted. In a region opposite to the substrate 112 with the fluorescent layer 124 sandwiched therebetween, a plate-shaped diffusion member 26 is disposed to oppose the fluorescent layer 124.

The light-emitting device according to the Comparative Example has a structure almost similar to that of the light-emitting device according to the Example so that, hereafter, structures and production methods different from those of the light-emitting device according to the Example will be described. Here, in the light-emitting device according to the Comparative Example, five semiconductor light-emitting elements 118 are mounted in one row in the same manner as in the Example. The gap between the semiconductor light-emitting elements 118 is set to be 5 mm.

As the semiconductor light-emitting element 118, a LED of 1 mm square having a light-emission peak at 450 nm (MvpLED™SL-V-B45AC manufactured by SemiLEDs Co., Ltd.) was used. As the phosphor, cerium-activated yttrium aluminum garnet (YAG phosphor: P46-Y3 manufactured by Kasei Optonics Co., Ltd.) was used.

Preparation of the fluorescent layer 124 was carried out as follows. First, with use of a dimethylsilicone resin (JCR6126 manufactured by Toray Dow Corning Silicone Co., Ltd.), the materials were weighed so that the phosphor concentration was 20 vol %. The mixing of the phosphor and the dimethylsilicone resin was carried out by a method similar to that of the Example. The obtained phosphor paste was formed into a sheet shape having a thickness of 180 μm with use of a bar coater, followed by curing at 150° C. for one hour to obtain a fluorescent sheet. The obtained fluorescent sheet was trimmed into 1 mm, and thereafter a dimethylsilicone resin (JCR6140 manufactured by Toray Dow Corning Silicone Co., Ltd.) was applied as a joining material, and the resultant was mounted on the semiconductor light-emitting element 118, followed by curing at 150° C. for one hour for fixing.

Figure 3A:
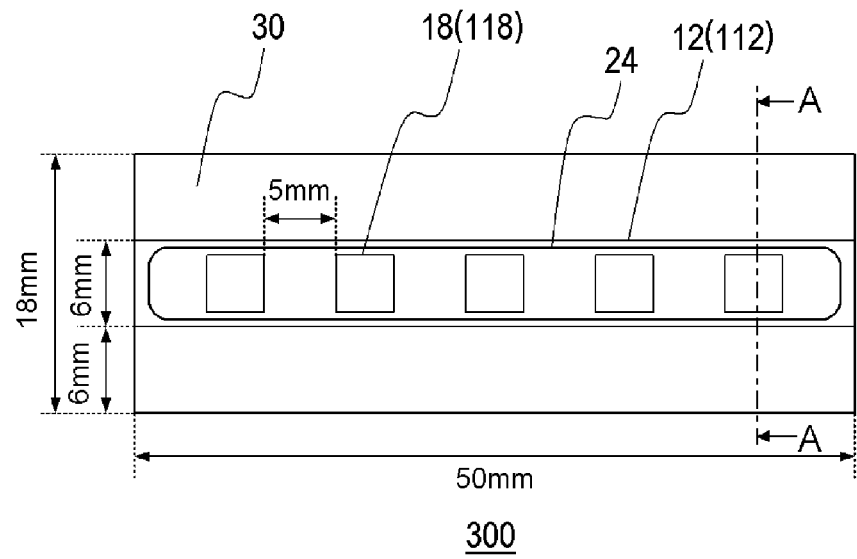
FIG. 3(a) is a top view of the illumination device.
Figure 3B:
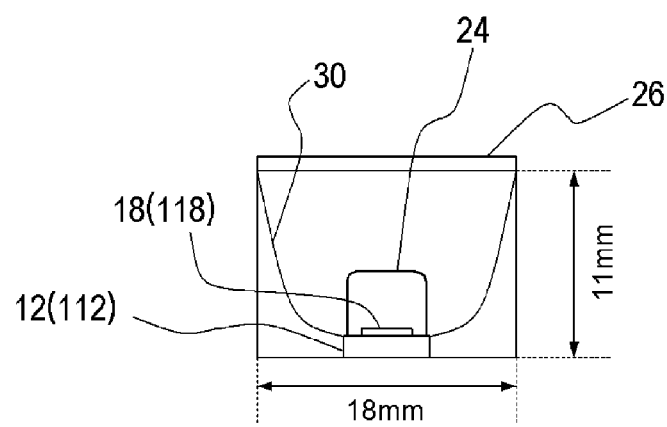
FIG. 3(b) is a cross-sectional view taken along line A-A of FIG. 3(a).

The light-emitting devices of the Example and the Comparative Example described above were placed in an illumination device fabricated in a simple manner as a trial case. FIG. 3(*a*) is a top view of the illumination device, and FIG. 3(*b*) is an A-A cross-sectional view of FIG. 3(*a*). As shown in the Figures, the illumination device 300 has a size of 50 mm×18 mm, and the gap between adjacent semiconductor light-emitting elements is set to be 5 mm. In the inside of the illumination device 300, an aluminum-vapor-deposited reflection surface 30 whose curved surface is constructed to direct the light emitted from the fluorescent layer 24 towards the diffusion member 26 is disposed. Also, the gap between the upper surface of the substrate 12 (112) and the diffusion member 26 is set to be 11 mm. Here, in FIGS. 3(*a*) and 3(*b*), the light-emitting device of the Example in which the fluorescent layer 24 is integral is described. The light-emitting device according to the Comparative Example is different mainly in that the separate and individual fluorescent layers 124 are disposed in place of the fluorescent layer 24 (See FIG. 2).

<Evaluation of Example>

The in-plane chromaticity distribution of the light-emission surface of the light-emitting devices according to the Example and the Comparative Example was measured. As the measurement device, a two-dimensional brightness meter (manufactured by Minolta Co., Ltd.) was used. The details will be omitted, but light emission by the light-emitting device according to the Example has an extremely narrow chromaticity distribution, and the variation in chromaticity within the light-emission surface is small. Therefore, with the light-emitting device according to the Example, uniform white light can be obtained over the whole light-emission surface.

Figure 4:
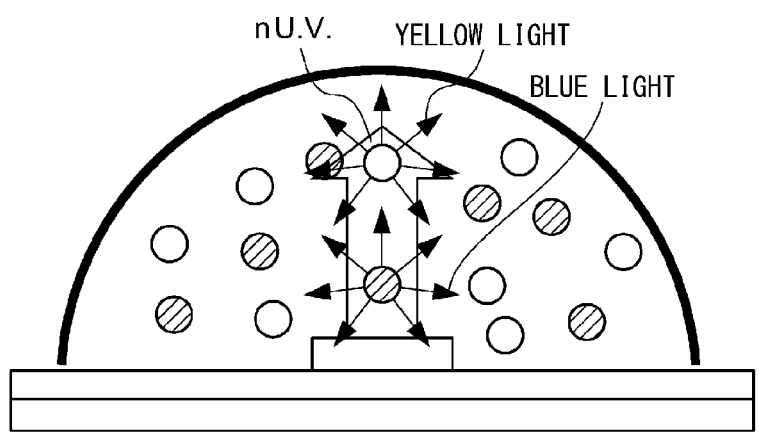
FIG. 4 is a view schematically showing a light emission model of a light-emitting device according to an Example.

FIG. 4 is a view schematically illustrating a light emission model of the light-emitting device according to the Example. As shown in FIG. 4, in the light-emitting device according to the Example, almost all of ultraviolet ray or short-wavelength visible light emitted from nU.V.-LED is absorbed by the phosphors, and Lambertian light emission is made in the first phosphor (Y) and in the second phosphor (B). Further, since the first phosphor absorbs little amount of blue light, the light emission color hardly changes even when the thickness of the resin layer containing the phosphors fluctuates. As a result of this, the variation in the chromaticity distribution of the light emission color seems to have been restrained.

Figure 5:
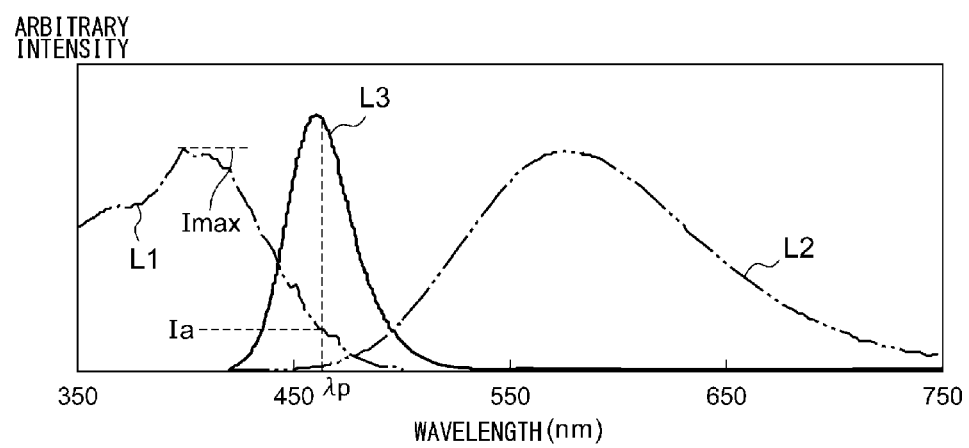
FIG. 5 is a view showing a light emission spectrum and excitation spectrum of the phosphors used in the light-emitting device in the Example.

Next, the influence of the cascade excitation on the color tone unevenness in the light-emitting device according to the Example will be described. FIG. 5 is a view showing a light emission spectrum and excitation spectrum of the phosphors used in the light-emitting device in the Example. Here, the line L1 shows an excitation spectrum of the first phosphor used in the Example, and the line L2 shows a light emission spectrum of the first phosphor used in the Example. Also, the line L3 shows a light emission spectrum of the second phosphor used in the Example.

As shown in FIG. 5, the region where the excitation spectrum (line L1) of the first phosphor in the light-emitting device according to the Example 2 overlaps with the light emission spectrum (line L3) of the second phosphor is small. In more detail, a relationship of $Ia<0.5\times Imax$ is satisfied, where $Imax$ is the maximum intensity of the excitation spectrum of the first phosphor, and $Ia$ is the intensity of the excitation spectrum of the first phosphor at the peak wavelength $\lambda p$ of the light emission spectrum of the second phosphor. This suppresses the light emitted from the second phosphor from being absorbed by the first phosphor to emit light again.

Here, the volume concentration of the whole of the phosphors contained in the fluorescent layer of each of the Examples is preferably 0.01 vol % or more and 10 vol % or less. When the volume concentration of the whole of the phosphors is 0.01 vol % or more, light that is bright to a certain degree can be obtained. Also, when the volume concentration of the whole of the phosphors is 10 vol % or less, the scattering or the damping that occur among the phosphor particles can be reduced. Also, in the fluorescent layer, the optical path length from the incidence of the light of the semiconductor light-emitting element till the exiting of the light to the outside is preferably 0.4 mm or more and 20 mm or less. In order to obtain such an optical path length, for example, the fluorescent layer may be constructed so that the thickness thereof in the direction perpendicular to the light-emission surface of the light-emitting element may be 0.4 mm or more and 20 mm or less. When the optical path length is 0.4 mm or more in this manner, the phosphors contained in the fluorescent layer can sufficiently absorb the primary light emitted by the semiconductor light-emitting element. Also, when the optical path length is 20 mm or less, the amount of use of the silicone resin can be restrained, so that the device can be provided at a low price. Also, the first phosphor preferably has an average particle size of 0.5 µm or more and 100 µm or less, and the second phosphor preferably has an average particle size of 0.5 µm or more and 100 µm or less. When the particle size is 0.5 µm or more, the ratio of the particle surface layer in which the activity of the phosphors is low can be reduced, whereby the light emission efficiency can be improved. Also, when the particle size is 100 µm or less, dispersion of the phosphors within the fluorescent layer is facilitated.

In this manner, in the light-emitting device according to the Example, white light is obtained by mixing the visible light that is emitted from the first phosphor excited by ultraviolet ray or short-wavelength visible light and having a peak wavelength in a wavelength region of 560 nm to 600 nm and the visible light that is emitted by the second phosphor excited by the ultraviolet ray or short-wavelength visible light and is in complementary color relationship with the visible light emitted by the first phosphor. For this reason, the variation in the chromaticity within the light-emission surface is suppressed as compared with the light-emitting device according to the Comparative Example in which a blue light-emitting element and a yellow phosphor are combined. Also, by suitably setting the volume concentration of the phosphors and the optical path length (shape and thickness of the fluorescent layer) in the fluorescent layer, the light emitted by the light-emitting elements is efficiently absorbed in the phosphors, and also the light emitted by a phosphor is suppressed from being absorbed or scattered by another phosphor. Thus, since the color unevenness that is a cause of illuminance unevenness is suppressed, an illumination device with little illuminance unevenness can be realized even when a diffusion plate having a comparatively high light transmittance is used.

Next, the total light beam transmittance of each diffusion plate used for measurement will be shown in Table 1. Diffusion plates having two kinds of plate thicknesses (1.5 mm, 2.5 mm) were placed as a diffusion member 26 at a position facing the substrate 12 (112) and being distant therefrom by 11 mm, and the brightness distribution was measured by a brightness meter.

TABLE 1

| PLATE THICKNESS | TOTAL LIGHT BEAM TRANSMITTANCE |
|---|---|
| 1.5 mm | 86% |
| 2.5 mm | 80% |

The light-emitting devices of the Example and the Comparative Example described above were mounted on a simply fabricated illumination device and were lit while adjusting the driving current so that the luminous flux emitted from the light-emitting devices of the Example and the Comparative Example would be the same. The result thereof will be shown in Table 2

TABLE 2

| | EXAMPLE | COMPARATIVE EXAMPLE |
|---|---|---|
| DRIVING CURRENT (DRIVING CURRENT THAT EQUALIZES THE LUMINOUS FLUX OF THE LIGHT-EMITTING DEVICE AS A SINGLE BODY) | 290 mA | 350 mA |
| LIGHT FLUX OF ILLUMINATION DEVICE (DIFFUSION PLATE t = 1.5 mm) | 1.23 | 1.04 |
| LIGHT FLUX OF ILLUMINATION DEVICE (DIFFUSION PLATE t = 1.8 mm) | 1.15 | 1.00 |

Also, by a two-dimensional brightness meter (manufactured by Minolta Co., Ltd.), the brightness distribution was measured in a state in which diffusion plates respectively having different thicknesses were mounted in the light-emitting devices of the Example and the Comparative Example. As a result thereof, the relative brightness ratio between the point exhibiting the maximum brightness within the diffusion plate surface and the low-brightness parts in the peripheries is shown in Table 3.

TABLE 3

| BRIGHTNESS RATIO | DIFFUSION PLATE THICKNESS OF 1.5 mm | | | DIFFUSION PLATE THICKNESS OF 2.5 mm | | |
|---|---|---|---|---|---|---|
| | Max | PERIPHERIES | PERIPHERIES/MAX | Max | PERIPHERIES | PERIPHERIES/MAX |
| EXAMPLE | 0.50 | 0.31 | 0.62 | 0.38 | 0.31 | 0.82 |
| COMPARATIVE EXAMPLE | 1.0 | 0.30 | 0.30 | 0.73 | 0.30 | 0.41 |

As a result thereof, it will be understood that, in the illumination device according to the Example, the difference between the maximum (Max) brightness and the peripheral brightness is small, and a uniform light emission is made, although the luminous flux is high.

In this manner, in the illumination device according to the Example, sufficient diffusion is exhibited to make planar light emission even when a diffusion member having a plate thickness of t=1.5 mm (total light beam transmittance of 86%) is used. On the other hand, in the illumination device according to the Comparative Example, sufficient diffusion is not obtained even when a diffusion member having a plate thickness of t=2.5 mm (total light beam transmittance of 80%) is used. In other words, in the illumination device according to the Example, the equipment efficiency can be enhanced while suppressing the illuminance unevenness.

This is because, in the illumination device according to the Example, the brightness unevenness or color unevenness of the light-emission surface (fluorescent layer surface) of the provided light-emitting device is suppressed. In view of suppressing the color unevenness, in the light-emitting device according to the Example, white color is realized by using light emission of a plural kinds of phosphors that are in a complementary color relationship, instead of a conventional combination of a blue LED and a YAG phosphor.

Also, in view of suppressing the brightness unevenness, in the light-emitting device according to the Example, the plurality of semiconductor light-emitting elements are integrally sealed with the fluorescent layer, and the light emission area is large, so that the brightness on the surface of the fluorescent layer can be reduced without lowering the total luminous flux. As a result thereof, in the light-emitting device according to the Example, the brightness unevenness on the surface of the fluorescent layer is small. On the other hand, in the light-emitting device according to the Comparative Example, the semiconductor light-emitting elements are separately and individually covered with the fluorescent layer, and also the fluorescent layer is not present between the semiconductor light-emitting elements, so that the light emission area is small and the brightness unevenness tends to be large as compared with the light-emitting device according to the Example. As a result thereof, in the illumination device according to the Comparative Example, it is difficult to suppress the illuminance unevenness unless a diffusion member having a low transmittance and having a high diffusivity is selected.

Also, in the illumination device according to the Example, the plurality of semiconductor light-emitting elements that the light-emitting device has are preferably arranged at an interval of 20 mm or less in view of suppressing the illuminance unevenness. Here, when the interval between the semiconductor light-emitting elements is made too small, the irradiation range is narrow, so that the plurality of semiconductor light-emitting elements are preferably arranged at an interval of 0.4 mm or more, more preferably 0.5 mm or more and 15 mm or less, in order to realize a uniform illumination over a wider range.

Also, in the illumination device according to the Example, the distance between the fluorescent layer and the diffusion member is preferably 3 mm or more in view of suppressing the illuminance unevenness. On the other hand, the distance between the fluorescent layer and the diffusion member is preferably 30 mm or less in view of reducing the scale and thickness of the illumination device.

Also, the diffusion member according to the Example preferably has a transmittance within a range from 80% to 95%. This suppresses decrease in the luminous flux when the light emitting from the light-emitting device is transmitted through the diffusion member. Also, the diffusion member preferably has a diffusivity of 10% or more. This allows that the light emitting from the light-emitting device is suitably scattered, and the illuminance unevenness is suppressed.

As shown above, the present invention has been described on the basis of the embodiment and the Example. This embodiment is an exemplification, and it will be understood by those skilled in the art that various modifications can be made in the combination of the constituent elements and treatment processes thereof, and such modifications are also comprised within the scope of the present invention.

In the above-described embodiments, an illumination device in which a plurality of semiconductor light-emitting elements are arranged in series has been described. However, it may be an illumination device in which the semiconductor light-emitting elements are arranged in a predetermined arrangement pattern such as a concentric circular pattern, a radially arranged pattern, or a rectangular pattern in accordance with the demanded illumination performance.

What is claimed is:

1. An illumination device comprising:
   a light-emitting device having (i) a plurality of light-emitting elements that emit ultraviolet ray or short-wavelength visible light having a peak wavelength in a wavelength region of 380 to 420 nm, (ii) a substrate on which the plurality of light-emitting elements are mounted, wherein all of the light-emitting elements on the substrate are arranged in a single row, (iii) a first phosphor that is excited by the ultraviolet ray or short-wavelength visible light and emits visible light having a peak wavelength in a wavelength region of 560 to 600 nm, (iv) a second phosphor that is excited by the ultraviolet ray or short-wavelength visible light and emits visible light in complementary color relationship with the visible light emitted by the first phosphor, and (v) a light-transmitting member that covers the plurality of light-emitting elements and contains the first phosphor and the second phosphor dispersed therein, so as to obtain white color by mixing the light from each of the first and second phosphors; and
   a diffusion member that has a diffusivity of 10% or more and diffuses at least a part of the light emitted from the light emitting device, said diffusion member having a plate shape and including (i) an incident surface which opposes the light-emitting surface of the light emitting device and on which light emitting from the light emitting device is incident, and (ii) a light-exiting surface from which light transmitted through the diffusion member exits and which is opposite to the incident surface,
   wherein a volume concentration of the whole phosphors contained in the light-transmitting member is 0.01 vol % or more and 10 vol % or less,
   wherein the light-transmitting member (i) has a shape having a thickness in a direction perpendicular to a light-exiting surface of the light-emitting elements of 0.4 mm or more and 20 mm or less and (ii) integrally seals the upper surface of the substrate on which the plurality of light-emitting elements are mounted,
   wherein a relationship of Ia<0.5×Imax is satisfied, where Imax is the maximum intensity of the excitation spectrum of the first phosphor, and Ia is the intensity of the excitation spectrum of the first phosphor at the peak wavelength of the light emission spectrum of the second phosphor,
   wherein the light-emitting elements are disposed so that an interval thereof to adjacent light-emitting elements is within a range of 0.4 mm to 20 mm, and
   wherein the diffusion member is disposed such that a distance thereof to the light-transmitting member is at least 3 mm.

2. The illumination device according to claim 1, wherein the first phosphor has an average particle size of 0.5 μm or more and 100 μm or less, and the second phosphor has an average particle size of 0.5 μm or more and 100 μm or less.

3. The illumination device according to claim 1, wherein the diffusion member is disposed so that a distance thereof to the light-transmitting member is 30 mm or less.

4. The illumination device according to claim 1, wherein the diffusion member has a transmittance within a range from 80% to 95%.

5. The illumination device according to claim 1, wherein the diffusion member has a transmittance and a diffusivity that are set so that the variation in the brightness of a surface on the light-exiting side is 45% or less.

6. The illumination device according to claim 2, wherein the diffusion member is disposed so that a distance thereof to the light-transmitting member is 30 mm or less.

7. The illumination device according to claim 2, wherein the diffusion member has a transmittance within a range from 80% to 95%.

8. The illumination device according to claim 2, wherein the diffusion member has a transmittance and a diffusivity that are set so that the variation in the brightness of a surface on the light-exiting side is 45% or less.

* * * * *